United States Patent [19]
Shimizu et al.

[11] Patent Number: 5,854,527
[45] Date of Patent: Dec. 29, 1998

[54] SURFACE ACOUSTIC WAVE DEVICE AND PORTABLE TELEPHONE USING SAME

[75] Inventors: Yasutaka Shimizu; Atsuhiro Nishikata, both of Tokyo; Shigetaka Tonami, Toyama, all of Japan

[73] Assignee: Sanyo Electric Co., Ltd., Osaka, Japan

[21] Appl. No.: 812,880

[22] Filed: Mar. 6, 1997

[30] Foreign Application Priority Data

Mar. 8, 1996 [JP] Japan .................................. 8-051808

[51] Int. Cl.⁶ ............................. H03H 9/25; H01L 41/08
[52] U.S. Cl. ...................................... 310/313 A; 310/360
[58] Field of Search .................................. 310/313 A, 360

[56] References Cited

U.S. PATENT DOCUMENTS

| | | |
|---|---|---|
| 4,409,571 | 10/1983 | Milsom et al. ................. 310/313 A |
| 5,081,389 | 1/1992 | Abbott et al. ................. 310/313 A |
| 5,420,472 | 5/1995 | Cho et al. ................. 310/344 |
| 5,548,256 | 8/1996 | Watanabe et al. ................. 310/313 B |

*Primary Examiner*—Thomas J. Dougherty
*Attorney, Agent, or Firm*—Armstrong, Westerman, Hattori, McLeland & Naughton

[57] ABSTRACT

The surface acoustic wave device of the invention comprises a piezoelectric substrate of lithium niobate or lithium tantalate and electrodes formed on the substrate for propagating surface acoustic waves. The substrate has a cut plane and a surface acoustic wave propagation direction which are ($\phi$, $\theta$, $\psi$) as expressed in Eulerian angles and within ranges substantially equivalent thereto. When the substrate is made of lithium niobate, $\phi$, $\theta$ and $\psi$ are 0°–86° or 95°–180°, 73°–118° and 0°–44°, respectively. When the substrate is made of lithium tantalate, $\phi$, $\theta$ and $\psi$ are 0°–87° or 91°–180°, 80°–120° and 0°–44°, respectively. This enables the device to exhibit high performance.

12 Claims, 15 Drawing Sheets

SURFACE ACOUSTIC WAVE DEVICE AND PORTABLE TELEPHONE USING SAME

FIELD OF THE INVENTION

The present invention relates to the technical field of surface acoustic wave devices wherein lithium niobate or lithium tantalate is used as a piezoelectric material.

BACKGROUND OF THE INVENTION

Surface acoustic wave devices are in wide use for communication devices, such as portable telephones, as circuit elements of resonator filters, signal processing delay lines, etc. Surface acoustic wave devices comprise, for example, interdigital electrodes and latticelike reflectors which are formed on the surface of a piezoelectric substrate to convert electrical signals to and from surface acoustic waves.

Generally the piezoelectric substrates of surface acoustic wave devices must have a great electromechanical coupling factor and be diminished in transmission loss.

With communications devices adapted for use at higher frequencies in recent years, there is an increasing need for surface acoustic wave devices which are usable in the gigahertz band. The center frequency f0 of the surface acoustic wave device is expressed by the following mathematical expression based on the relationship between the acoustic wave propagation velocity V and the electrode period L (=wavelength λ.)

Mathematical Expression 1

$$f0 = V/L$$

To provide surface acoustic wave devices of higher frequency, therefore, it is necessary to develop piezoelectric substrates for giving a higher propagation velocity (phase velocity) V. This can be accomplished by using a hard substrate material such as diamond, or by utilizing so-called leaky surface acoustic waves. Leaky surface acoustic waves are acoustic waves which propagate along the surface of an elastic body while releasing energy depthwise thereof. It is possible to realize diminished propagation losses and wave velocities higher than that of Rayleigh waves by suitably selecting the cut plane of surface of the elastic body to be used and the propagation direction.

Already known as surface acoustic wave devices for use with leaky surface acoustic waves are quartz LST cut, 41° Y-X cut and 64° Y-X cut of lithium niobate (LiNbO$_3$) and 36° Y-X cut of lithium tantalate (LiTaO$_3$) (Yasutaka Shimizu, "Propagation Properties of Surface Acoustic Wave Materials as Utilized Presently," Transactions A of the Institute of Electronics, Information and Communication Engineers (IEICE), Vol. J76-A, No. 2, pp. 129–137, 1993).

Further a report has been made on leaky surface acoustic waves propagating on lithium tetraborate (Li$_2$B$_4$O$_7$) substrates at a velocity exceeding the phase velocity of rapid transverse waves (Takahiro Satoh and Hidenori Abe, "Longitudinal Leaky Surface Acoustic Wave on Lithium Tetraborate Substrates," Proceedings of the 1994 IEICE Spring Conference). Since the phase velocity of these leaky surface acoustic waves is approximate to that of longitudinal waves, these waves are called leaky waves of the longitudinal wave type.

Furthermore, a report has already been made on leaky surface acoustic waves propagating on a lithium niobate substrate having an optional cut plane (Yasutaka Shimizu and Junji Murakami, "Characteristics of Leaky Surface Acoustic Waves on LiNbO$_3$ Substrate and New Cut," Transactions C of the IEICE Vol. J69-C, No. 10, pp. 1309–1318, 1986).

In view of the conventional lithium tantalate substrates and lithium niobate substrates which afforded a phase velocity of about 4400 m/s, we thought it likely that cut planes and surface acoustic wave propagation directions of higher phase velocity would be present, and carried out theoretical research on the propagation characteristics of leaky surface acoustic waves on lithium tantalate substrates and lithium niobate substrates, with the cut plane and the surface acoustic wave propagation directions altered variously. Consequently, we discovered two types of leaky surface acoustic waves, i.e., first leaky waves which are intermediate between slow transverse waves and rapid transverse waves in phase velocity, and second leaky waves having a phase velocity exceeding that of rapid transverse waves, and found cut planes and acoustic wave propagation directions which give a phase velocity of over about 6000 m/s on lithium tantalate substrates and a phase velocity exceeding about 7000 m/s on lithium niobate substrates (The proceedings of the 15th Symposium on Fundamentals and Applications of Ultrasonic Electronics, 1994, pp. 185–186).

First with reference to FIG. 15, Eulerian angles ($\phi$, $\theta$, $\psi$) will be described for specifying the cut plane and the surface acoustic wave propagation direction.

Assuming that the crystal axes are X, Y and Z as illustrated, the X-axis is rotated about the Z-axis toward the Y-axis through an angle $\phi$ to provide an A1-axis. Next, the Z-axis is rotated about the A1-axis counterclockwise through an angle $\theta$ to provide an A2-axis. The crystal is cut in a plane containing the A1-axis with the A2-axis serving as a normal to provide a substrate. With the substrate thus cut, the A1-axis is rotated about the A2-axis counterclockwise through an angle $\psi$ to provide an A3-axis which is to be the surface acoustic wave propagation direction. At this time, the cut plane and the wave propagation direction are expressed in Eulerian angles ($\phi$, $\theta$, $\psi$).

The research mentioned will be described in greater detail with reference to FIGS. 11 to 14. In evaluating the characteristics of surface acoustic wave devices, the phase velocity, electromechanical coupling factor and propagation loss were calculated by computer simulation using a common method conventionally known (see, for example, J. J. Campbell and W. R. Jones, "A Method for Estimating Optimal Crystal Cuts and Propagation Directions for Excitation of Piezoelectric Surface Waves," IEEE Transaction on Sonics and Ultrasonics, Vol. SU-15, No. 4, pp. 209–217, (1968)).

When surface acoustic wave devices were actually prepared on an experimental basis and checked for characteristics, measurements corresponding to the simulation results were obtained with respect to the optimum cut plane and wave propagation direction. Thus, the computer simulation was found justifiable.

FIGS. 11 and 12 show the propagation characteristics of second leaky waves expressed as a function of the angle $\psi$ and determined for the two cases of an electrically open surface and an electrically shorted surface using lithium tantalate substrates with (90°, 90°, $\psi$) cut.

FIG. 11 shows that in both cases of open and shorted surfaces, the phase velocity of second leaky waves is about 6000 m/s which is nearly twice as high as that of Rayleigh waves and very close to that of longitudinal waves.

FIG. 12, showing the electromechanical coupling factor and the propagation loss per wavelength, reveals that the electromechanical coupling factor K$^2$ has a maximum value of 2.14% at an angle $\psi$ of 31°, further indicating that the propagation loss is much smaller when the surface is electrically open than when the surface is electrically shorted. In both cases of open and shorted surfaces, the loss becomes nearly zero at $\psi$ 164°.

FIGS. 13 and 14 show the propagation characteristics of second leaky waves expressed as a function of the angle ψ and determined for the two cases of an electrically open surface and an electrically shorted surface using lithium niobate substrates with (90°, 90°, ψ) cut.

FIG. 13 shows that the phase velocity of second leaky waves is about 7000 m/s which is exceedingly high and nearly twice that of Rayleigh waves, and varies in different modes when the surface is electrically open and when it is electrically shorted, with a difference of about 500 m/s at ψ 37° between the two cases. As a result, a very great electromechanical coupling factor is available.

FIG. 14, showing the electromechanical coupling factor and the propagation loss per wavelength, reveals that the electromechanical coupling factor $K^2$ has a great maximum value of 12.9% at an angle ψ of 37°, further indicating that the propagation loss is much smaller when the surface is electrically open than when the surface is electrically shorted. In both cases of open and shorted surfaces, the loss becomes nearly zero at ψ 164°.

Based on the foregoing results, our report states that the lithium tantalate substrate preferably has (90°, 90°, ψ) cut, more preferably (90°, 90°, 31°) cut, and that the lithium niobate substrate preferably has (90°, 90°, ψ) cut, more preferably (90°, 90°, 37°) cut.

However, the propagation loss was not fully investigated in the foregoing research, and it is likely that there will be cut planes and wave propagation directions realizing a further diminished propagation loss.

SUMMARY OF THE INVENTION

An object of the present invention is to discover for lithium niobate substrates and lithium tantalate substrates a cut plane and a surface acoustic wave propagation direction adapted for a reduced propagation velocity while maintaining a high phase velocity and a great electromechanical coupling factor comparable to those conventionally available, and to thereby provide surface acoustic wave devices of high performance and portable telephones comprising the device.

The present invention provides a first surface acoustic wave device comprising a piezoelectric substrate of lithium niobate and electrodes formed on the substrate for propagating surface acoustic waves, the device being characterized in that the piezoelectric substrate has a cut plane and a surface acoustic wave propagation direction which are (φ, θ, ψ) as expressed in Eulerian angles and within ranges substantially equivalent thereto, the angles φ, θ and ψ being within the respective ranges of Mathematical Expressions 2 given below.

Mathematical Expressions 2

$$0°≤φ≤86°, \text{ or } 95°≤φ≤180°$$

$$73°≤θ≤118°$$

$$0°≤ψ≤44°$$

Preferably, the angles φ, θ and ψ are within the respective ranges of Mathematical Expressions 3 given below.

Mathematical Expressions 3

$$0°≤φ≤83°, \text{ or } 98°≤φ≤180°$$

$$83°≤θ≤105°$$

$$0°≤ψ≤38°$$

The first surface acoustic wave device is comparable to conventional devices in phase velocity and electromechanical coupling factor and yet as small as up to 0.05 dB/λ in propagation loss when the lithium niobate substrate has (0°≤φ≤86°, 73°≤θ≤118°, 0°≤ψ≤44°) cut or (95°≤φ≤180°, 73°≤θ≤118°, 0°≤ψ≤44°) cut.

The propagation loss still reduces to not greater than 0.02 dB/λ when the lithium niobate substrate has (0°≤φ≤83°, 83°≤θ≤105°, 0°≤ψ≤38°) cut or (98°≤φ≤180°, 83°≤θ≤105°, 0°≤ψ≤38°) cut.

The present invention provides a second surface acoustic wave device comprising a piezoelectric substrate of lithium tantalate and electrodes formed on the substrate for propagating surface acoustic waves, the device being characterized in that the piezoelectric substrate has a cut plane and a surface acoustic wave propagation direction which are (φ, θ, ψ) as expressed in Eulerian angles and within ranges substantially equivalent thereto, the angles φ, θ and ψ being within the respective ranges of Mathematical Expressions 4 given below.

Mathematical Expressions 4

$$0°≤φ≤87°, \text{ or } 91°≤φ≤180°$$

$$80°≤θ≤120°$$

$$0°≤ψ≤44°$$

Preferably, the angles φ, θ and ψ are within the respective ranges of Mathematical Expressions 5 given below.

Mathematical Expressions 5

$$0°≤φ≤85°, \text{ or } 93°≤φ≤180°$$

$$87°≤θ≤114°$$

$$0°≤ψ≤36°$$

The second surface acoustic wave device is comparable to conventional devices in phase velocity and electromechanical coupling factor and yet as small as up to 0.005 dB/λ in propagation loss when the lithium tantalate substrate has (0°≤φ≤87°, 80°≤θ≤120°, 0°≤ψ≤44°) cut or (91°≤φ≤180°, 80°≤θ≤120°, 0°≤ψ≤44°) cut.

The propagation loss still reduces to not greater than 0.002 dB/λ when the lithium tantalate substrate has (0°≤φ≤85°, 87°≤θ≤114°, 0°≤ψ≤36°) cut or (93°≤φ≤18°, 87°≤θ≤114°, 0°≤ψ≤36°) cut.

According to the present invention, the lithium niobate substrate and the lithium tantalate substrates are each given suitably specified cut plane and surface acoustic wave propagation direction, whereby the substrates can be assured of a high phase velocity and a great electromechanical coupling factor comparable to the respective values conventionally available to realize a diminished propagation loss.

DETAILED DESCRIPTION OF EMBODIMENTS

Figure 1:
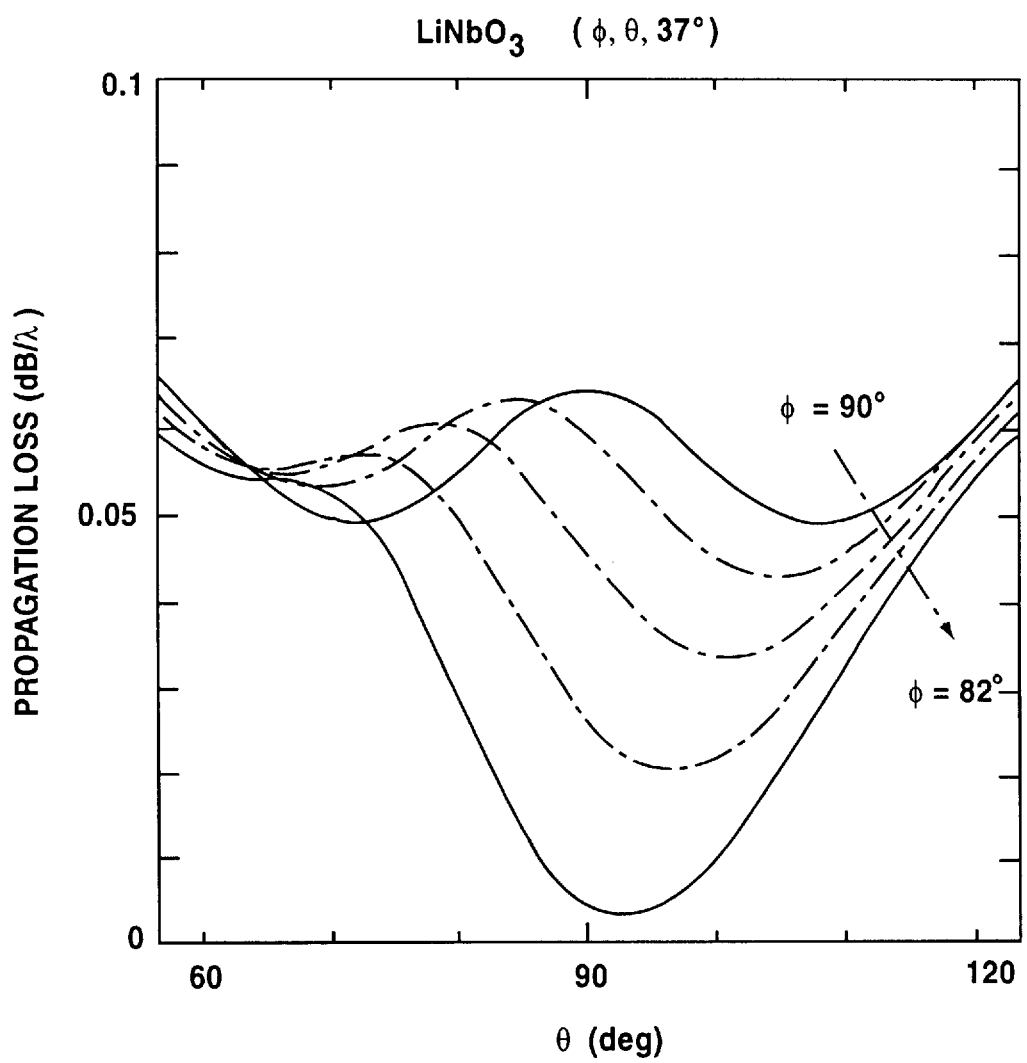
FIG. 1 is a graph showing the propagation loss characteristics of surface acoustic wave devices having a lithium niobate substrate with (φ, θ, 37°) ) cut.

First, a description will be given of the propagation characteristics of second leaky waves on lithium niobate substrates and lithium tantalate substrates with reference to the results of computer simulation shown in FIGS. 1 to 8.
Second Leaky Waves on Lithium Niobate Substrates FIG. 1 shows the propagation loss per wavelength of second leaky waves on lithium niobate substrates with (φ, θ, 37°) cut, expressed as a function of the angle θ.

When φ is altered variously from 90° to 82°, the propagation loss gradually decreases if θ is at least about 85° as illustrated.

At φ of 82°, the propagation loss is up to 0.05 dB/λ when θ is at least 73° to not greater than 188°, up to 0.04 dB/λ when θ is at least 77° to not greater than 113°, up to 0.03 dB/λ when θ is at least 80° to not greater than 109°, up to 0.02 dB/λ when θ is at least 83° to not greater than 105°, and up to 0.01 dB/λ when θ is at least 87° to not greater than 100°. The propagation loss is minimum at θ 92°.

Figure 2:
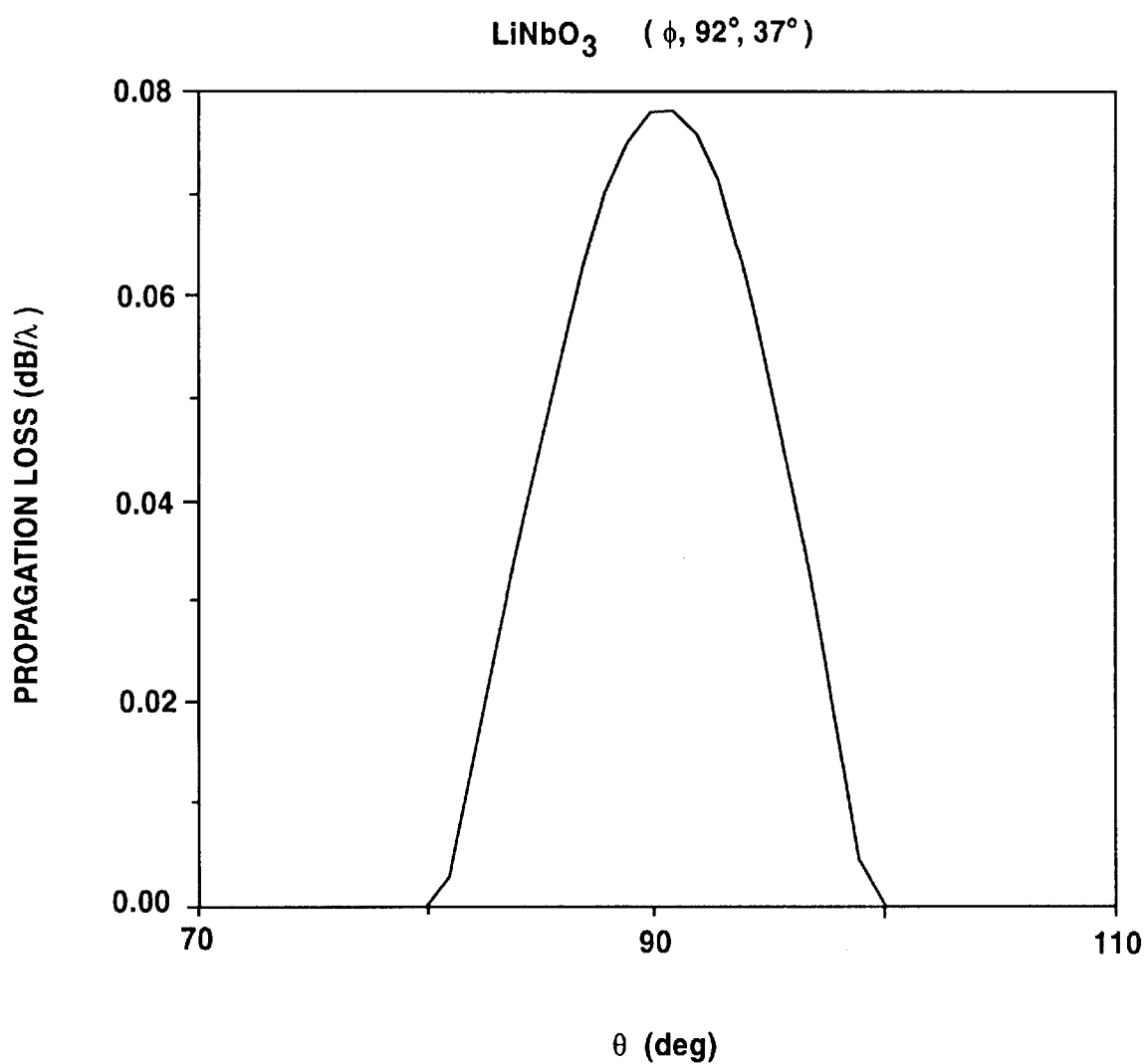
FIG. 2 is a graph showing the propagation loss characteristics of surface acoustic wave devices having a lithium niobate substrate with (φ, 92°, 37°) cut.

FIG. 2 shows the propagation loss per wavelength of second leaky waves on lithium niobate substrates with (φ, 92°, 37°) cut, expressed as a function of the angle φ.

As illustrated, the propagation loss is maximum at φ 91°, up to 0.05 dB/λ when φ is up to 86° or at least 95°, up to 0.04 dB/λ when φ is up to 85° or at least 96°, up to 0.03 dB/λ when φ is up to 84° or at least 97°, up to 0.02 dB/λ when φ is up to 83° or at least 98°, and up to 0.01 dB/λ when φ is up to 82° or at least 99°. No solution is available from computer simulation if φ is up to about 80° or at least about 100°. The reason appears to be that a mode different from the mode of second leaky waves to be used in the invention then occurs to obliterate second leaky waves. With actual surface wave devices, however, the propagation loss will presumably be nearly zero in these angular ranges.

Figure 3:
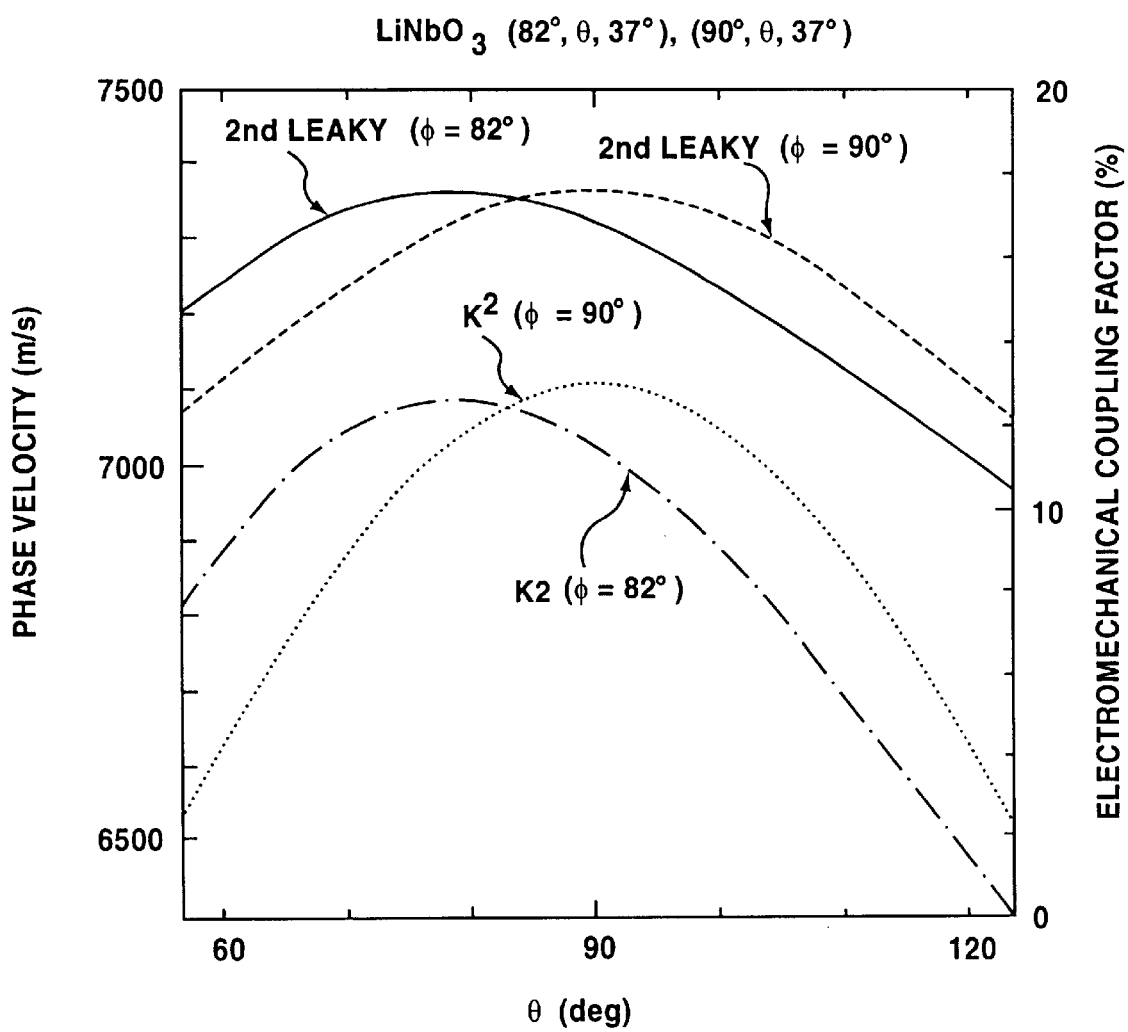
FIG. 3 is a graph showing the phase velocity and electromechanical coupling factor characteristics of surface acoustic wave devices having a lithium niobate substrate with (82°, θ, 37°) cut and surface acoustic wave devices having a lithium niobate substrate with (90°, θ, 37°) cut.

FIG. 3 shows the phase velocity of second leaky waves on, and the electromechanical coupling factor $K^2$ of, lithium niobate substrates with (82°, θ, 37°) cut and those with (90°, θ, 37°) cut, expressed as a function of the angle θ.

As illustrated, the phase velocity of second leaky waves varies in the same manner at φ 82° and at φ 90°. The variations at the former angle, which correspond to those at the latter angle as shifted leftward generally, are comparable thereto in value. Further the electromechanical coupling factor $K^2$ at φ 82° varies in the same manner as the factor $K^2$ at φ 90°, and the former variations are comparable to the latter variations in value although generally shifted leftward therefrom.

Figure 4:
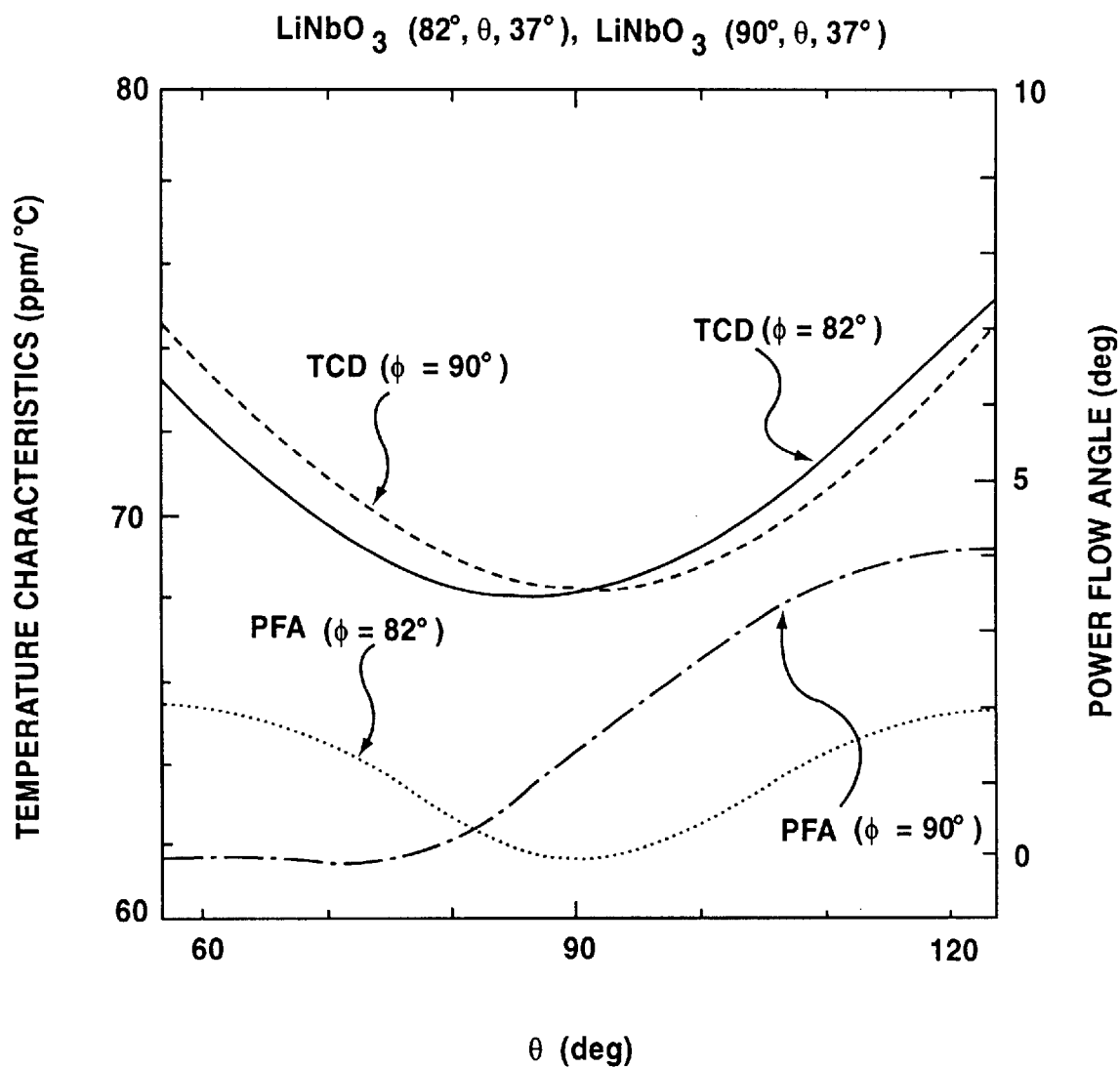
FIG. 4 is a graph showing the TCD and PFA characteristics of these two types of surface acoustic wave devices.

FIG. 4 shows the characteristics established for lithium niobate substrates with (82°, θ, 37°) cut and those with (90°, θ, 37°) cut, i.e., TCD (temperature coefficient of delay) of second leaky waves and PFA (power flow angle) expressed as a function of the angle θ.

As illustrated, the TCD at φ 82° varies in the same manner as the TCD at φ 90°, and the former variations are comparable to the latter variations in value although generally shifted leftward therefrom. The TCD at φ 82° decreases to a minimum of about 68 ppm/°C. when θ is 85°.

The PFA at φ 82° is generally smaller than the PFA at φ 90°, and up to 2 deg over the entire θ range of 60° to 120°.

Figure 5:
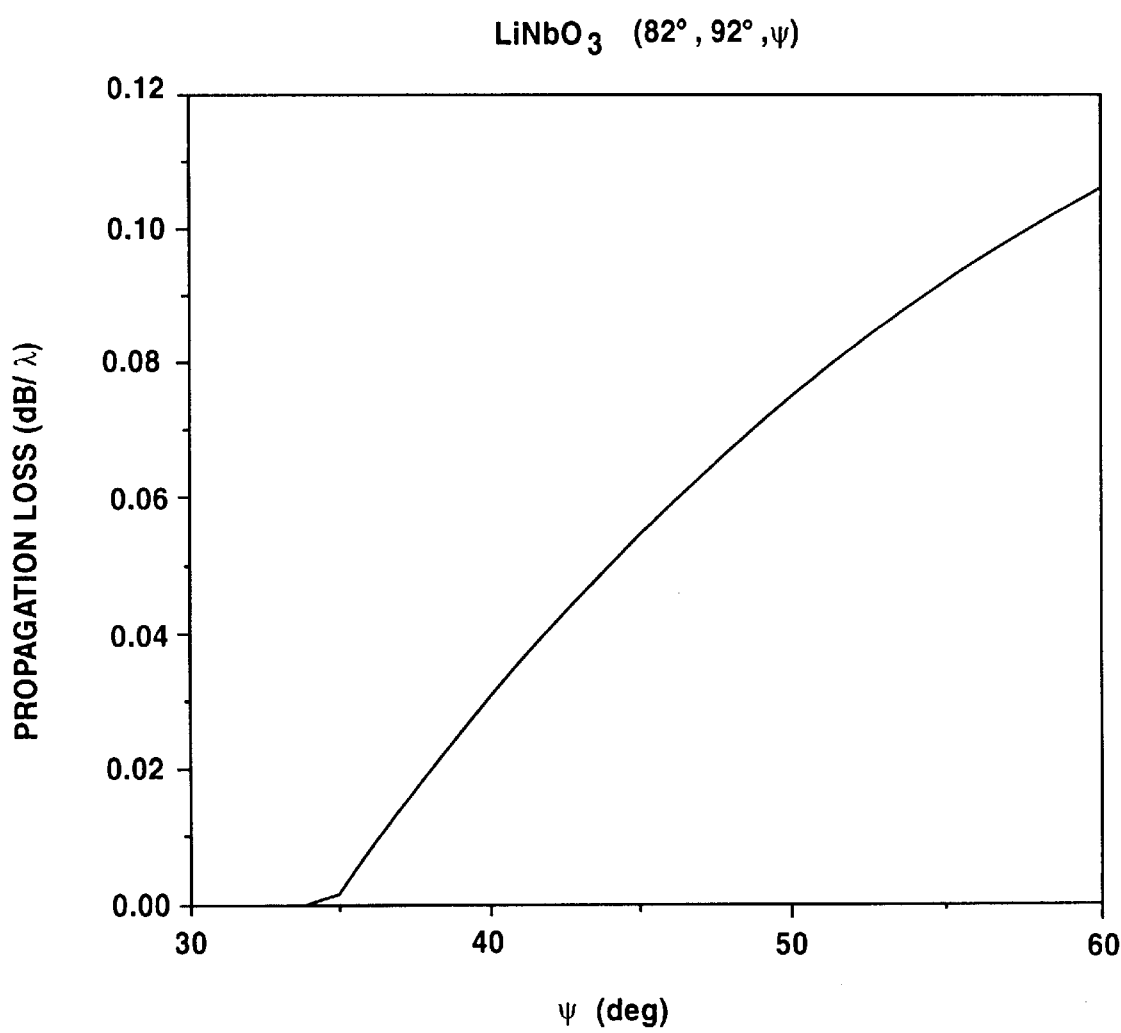
FIG. 5 is a graph showing the propagation loss characteristics of surface acoustic wave devices having a lithium niobate substrate with (82°, 92°, ψ) cut.

FIG. 5 shows the propagation loss per wavelength of second leaky waves on lithium niobate substrates with (82°, 92°, ψ) cut, expressed as a function of the angle ψ.

As illustrated, the propagation loss is up to 0.05 dB/λ when ψ is not greater than 44°, up to 0.04 dB/λ when ψ is not greater than 42°, up to 0.03 dB/λ when ψ is not greater than 40°, up to 0.02 dB/λ when ψ is not greater than 38°, and up to 0.01 dB/λ when ψ is not greater than 36°. No solution is obtained by computer simulation when ψ is up to about 34°. The reason appears to be that a mode different from the mode of second leaky waves then occurs to obliterate second leaky waves. With actual surface wave devices, however, the propagation loss will presumably be closely approximate to zero in this angular range.

Table 1 below shows the propagation characteristics of a lithium niobate substrate with (82°, 92°, 37°) cut of the invention and those of a prior-art lithium niobate substrate with (90°, 90°, 37°) cut.

TABLE 1

|  | Invention | Prior art |
| --- | --- | --- |
| Cut orientation | (82°, 92°, 37°) | (90°, 90°, 37°) |
| Propagation loss (dB/λ) | 0.00362 | 0.06447 |
| Phase velocity (m/s) | 7304.99087 | 7366.02862 |
| $K^2$ (%) | 10.924 | 12.906 |
| TCD (ppm/°C.) | 68.4119 | 68.2473 |
| PFA (°) | 1.665 | −0.096 |

As will be apparent from Table 1 above, the propagation loss involved in the present invention has a greatly reduced value which is about 1/20 of the propagation loss of the prior art. The invention is comparable to the prior art in phase velocity, electromechanical coupling factor $K^2$ and TCD. Although the invention is greater than the prior art in the absolute value of PFA, the angle leads to no trouble in the operation of the surface acoustic wave device.

When the lithium niobate substrate is adapted to have a cut plane and a surface acoustic wave propagation direction which are in the ranges of (0°–86°, 73°–118°, 0°–44°) or (95°–180°, 73°–118°, 0°–44°), more preferably in the range of (0°–83°, 83°–105°, 0°–38°) or (98°–180°, 83°–105°, 0°–38°), most preferably (82°, 92°, 37°), a high phase velocity and a great electromechanical coupling factor which are comparable to the respective conventional values can be ensured to result in a diminished propagation loss.

Second Leaky waves on Lithium Tantalate Substrates

Figure 6:
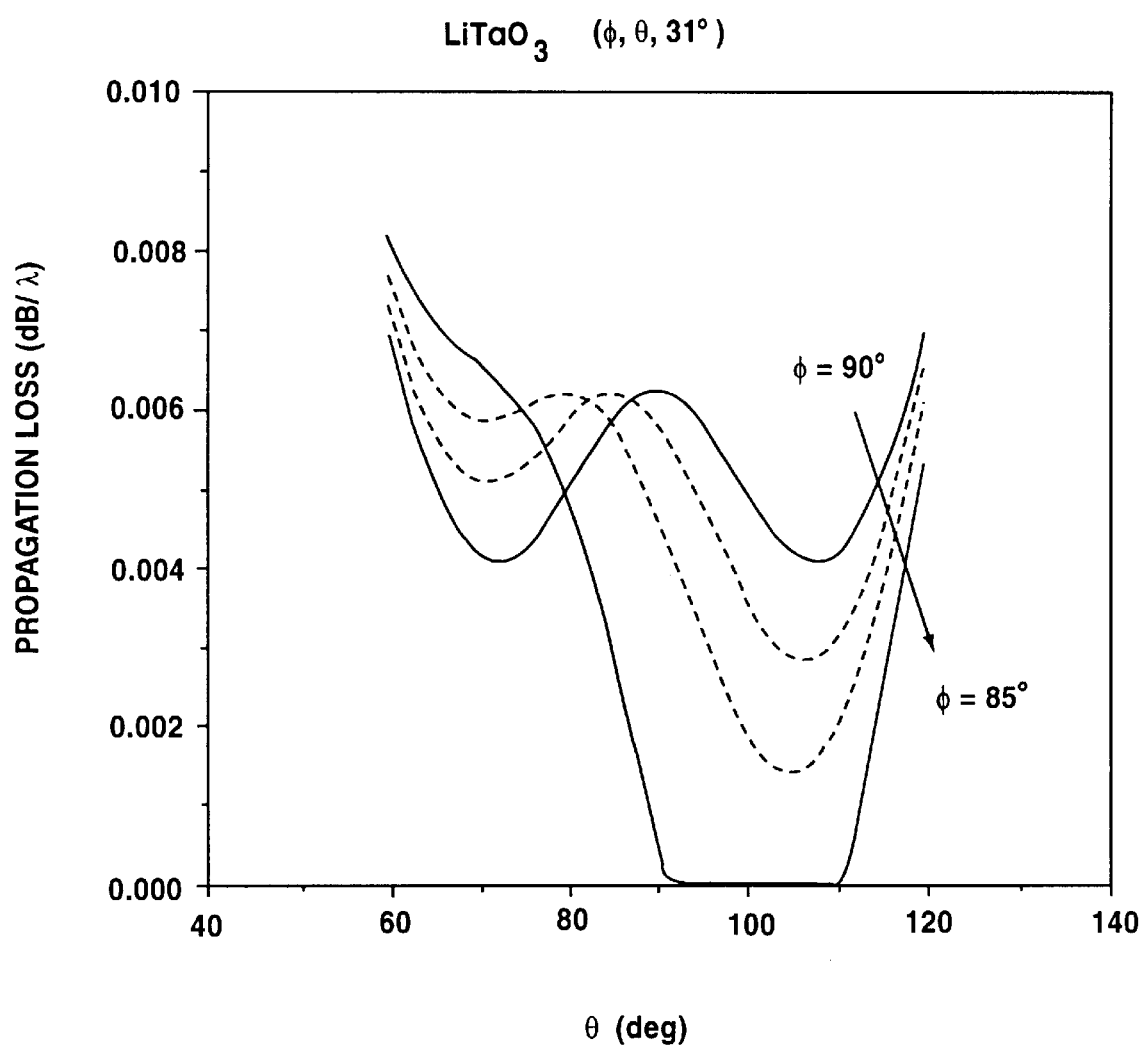
FIG. 6 is a graph showing the propagation loss characteristics of surface acoustic wave devices having a lithium tantalate substrate with (φ, θ, 31°) cut.

FIG. 6 shows the propagation loss per wavelength of second leaky waves on lithium tantalate substrates with (φ, θ, 31°) cut, expressed as a function of the angle θ.

When φ is altered variously from 90° to 85°, the propagation loss gradually decreases over the θ range of at least about 90° to not greater than about 120° as illustrated.

At φ 85°, the propagation loss decreases as θ increases over the range of at least about 60° to not greater than about 91°, and increases as θ increases over the range of at least about 110° to not greater than about 120°. No solution is available from computer simulation if θ is in the range of at least about 91° to not greater than about 110°. The reason appears to be that a mode different from the mode of second leaky waves then occurs to obliterate second leaky waves. With actual surface wave devices, however, the propagation loss will presumably be very close to zero in this angular range.

The propagation loss is up to 0.005 dB/λ when θ is at least 80° to not greater than 120°, up to 0.004 dB/λ when θ is at least 82° to not greater than 118°, up to 0.003 dB/λ when θ is at least 85° to not greater than 116°, up to 0.002 dB/λ when θ is at least 87° to not greater than 114°, and up to 0.001 dB/λ when θ is at least 89° to not greater than 112°.

Figure 7:
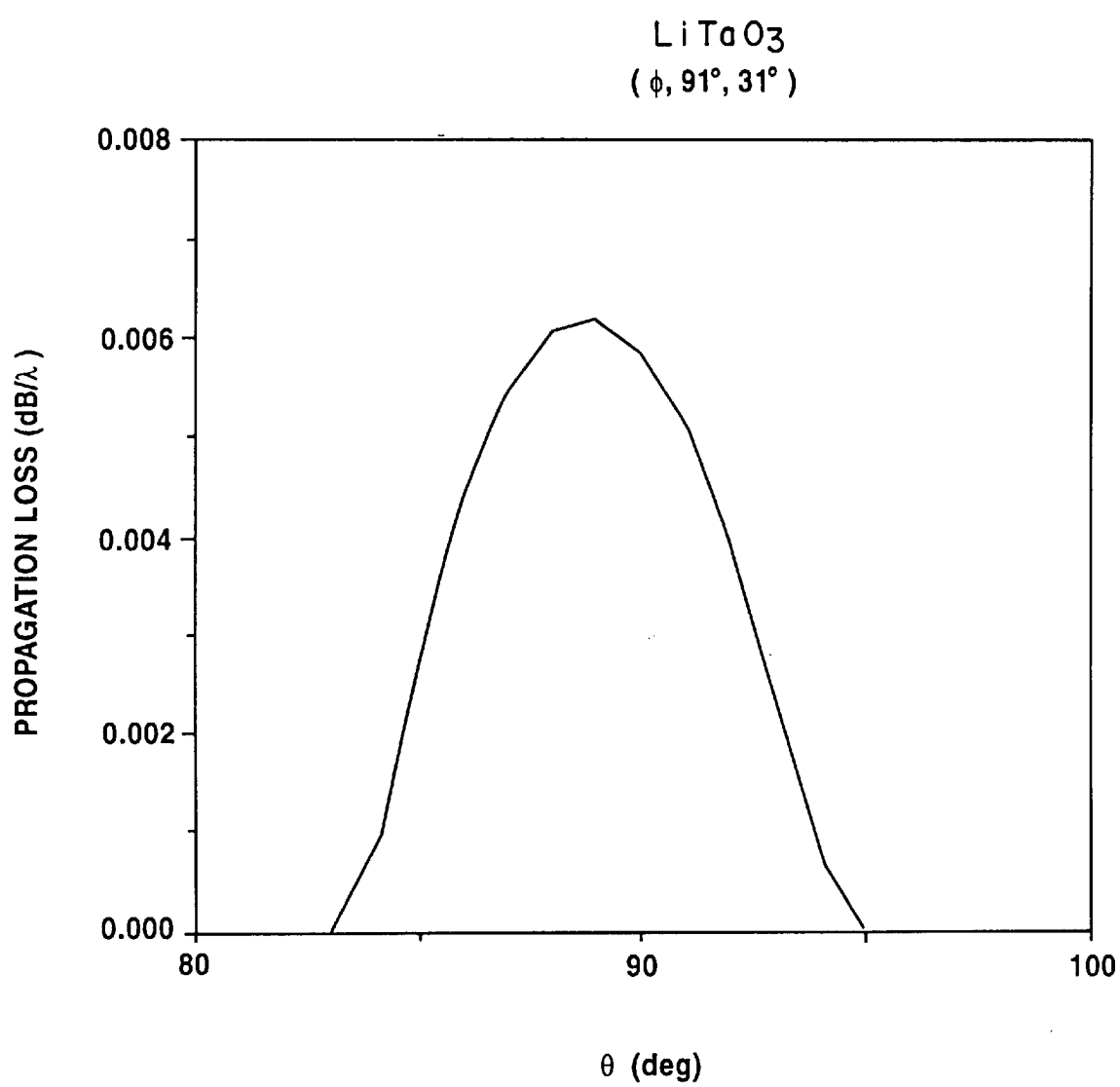
FIG. 7 is a graph showing the propagation loss characteristics of surface acoustic wave devices having a lithium tantalate substrate with (φ, 91°, 31°) cut.

FIG. 7 shows the propagation loss per wavelength of second leaky waves on lithium tantalate substrates with (φ, 91°, 31°) cut, expressed as a function of the angle φ.

As illustrated, the propagation loss is maximum at φ 89°, up to 0.005 dB/λ when φ is up to 87° or at least 91°, up to 0.004 dB/λ when φ is up to 86° or at least 92°, up to 0.003 dB/λ when φ is up to 85° or at least 93°, up to 0.002 dB/λ when φ is up to 85° or at least 93°, and up to 0.001 dB/λ when φ is up to 84° or at least 94°. No solution is available from computer simulation if φ is up to about 83° or at least about 95°. The reason appears to be that a mode different from the mode of second leaky waves then occurs to obliterate second leaky waves. With actual surface wave devices, however, the propagation loss will presumably be very close to zero in these angular ranges.

Figure 8:
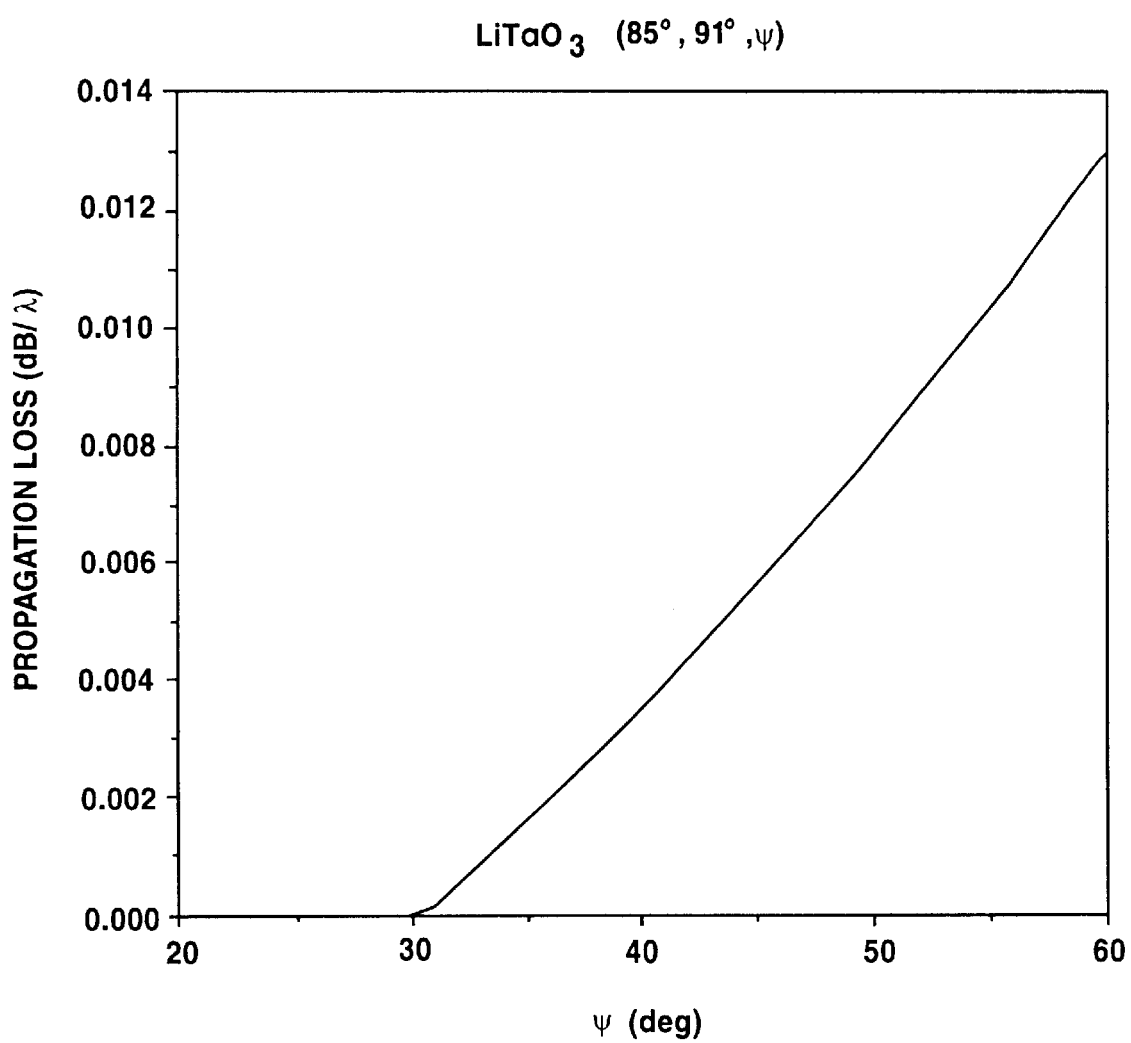
FIG. 8 is a graph showing the propagation loss characteristics of surface acoustic wave devices having a lithium tantalate substrate with (85°, 91°, ψ) cut.

FIG. 8 shows the propagation loss per wavelength of second leaky waves on lithium tantalate substrates with (85°, 91°, ψ) cut, expressed as a function of the angle ψ.

As illustrated, the propagation loss is up to 0.005 dB/λ when ψ is not greater than 44°, up to 0.004 dB/λ when ψ is not greater than 41°, up to 0.003 dB/λ when ψ is not greater than 39°, up to 0.002 dB/λ when ψ is not greater than 36° and up to 0.001 dB/λ when ψ is not greater than 34°. No solution is obtained by computer simulation when ψ is up to about 30°. The reason appears to be that a mode different from the mode of second leaky waves then occurs to obliterate second leaky waves. With actual surface wave devices, however, the propagation loss will presumably be very close to zero in this angular range.

Table 2 below shows the propagation characteristics of a lithium tantalate substrate with (85°, 91°, 31°) cut of the invention and those of a prior-art lithium tantalate substrate with (90°, 90°, 31°) cut.

TABLE 2

|  | Invention | Prior art |
| --- | --- | --- |
| Cut orientation | (85°, 91°, 31°) | (90°, 90°, 31°) |
| Propagation loss (dB/λ) | 0.00010 | 0.00617 |
| Phase velocity (m/s) | 6238.93060 | 6263.52891 |
| $K^2$ (%) | 1.549 | 1.798 |
| TCD (ppm/°C.) | 46.9036 | 47.1104 |
| PFA (°) | 4.430 | 4.081 |

As will be apparent from Table 2 above, the propagation loss involved in the present invention has a greatly reduced value which is about 1/60 of the propagation loss of the prior art. The invention is comparable to the prior art in phase velocity, electromechanical coupling factor $K^2$ and TCD. Although the invention is greater than the prior art in the absolute value of PFA, the angle leads to no trouble in the operation of the surface acoustic wave device.

When the lithium tantalate substrate is adapted to have a plane orientation and a surface acoustic wave propagation direction which are in the ranges of (0°–87°, 80°–120°, 0°–44°) or (91°–180°, 80°–120°, 0°–44°) more preferably in the range of (0°–85°, 87°–114°, 0°–36°) or (93°–180°, 87°–114°, 0°–36°), most preferably (85°, 91°, 31°), a high phase velocity and a great electromechanical coupling factor which are comparable to the respective conventional values can be ensured to result in a diminished propagation loss.

While the characteristics shown in FIGS. 1 to 8 are determined by computer simulation, even if the aforementioned method used for the embodiments for evaluating the characteristics involves some errors, for example, in preparing models of surface acoustic wave devices, the abscissa direction of the graphs of FIGS. 1 to 8 is thought to be almost free of such errors.

The invention will be described below in greater detail with reference to a case wherein the invention is applied to a surface acoustic wave device to provide a surface acoustic wave filter for portable telephones.

Figure 9:
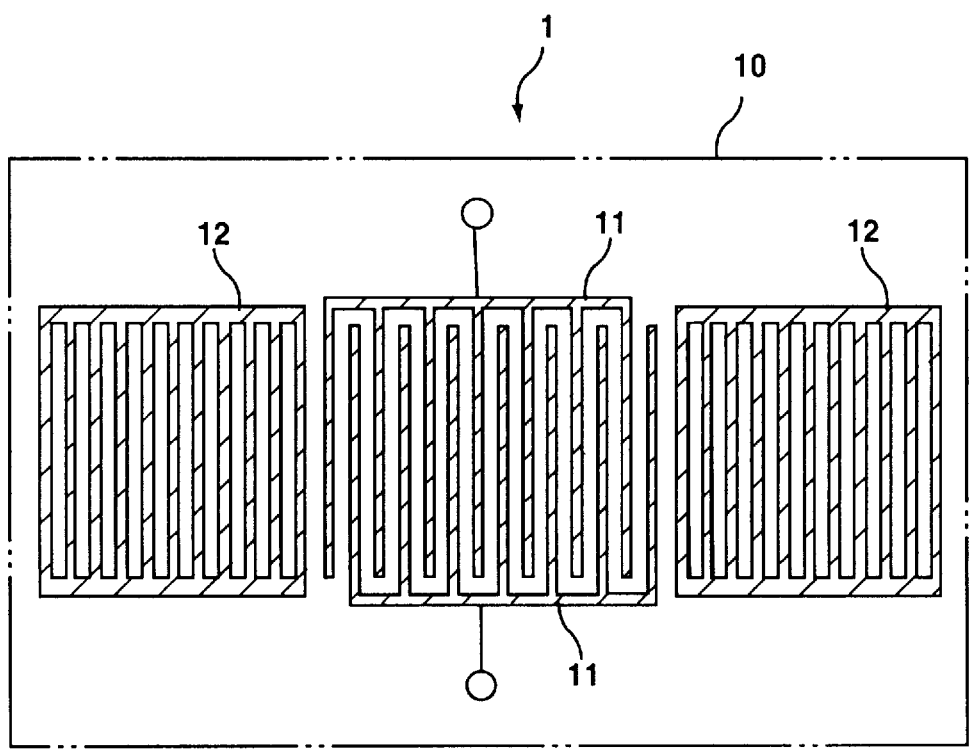
FIG. 9 is a plan view showing a single-port resonator constituting a surface acoustic wave device.

The surface acoustic wave filter embodying the invention comprising a surface acoustic wave device 1 shown in FIG. 9 or a plurality of such devices in combination. As illustrated, the device 1 comprises a pair of comblike electrodes 11, 11 and latticelike reflectors 12, 12 which are formed on a surface of a substrate 10.

When the substrate 10 is a lithium niobate substrate, the substrate has a plane orientation and a surface acoustic wave propagation direction which are, as expressed in Eulerian angles, inthe ranges of (0°–86°, 73°–118°, 0°–44°) or (95°–180°, 73°–118°, 0°–44°), more preferably in the range of (0°–83°, 83°–105°, 0°–38°) or (98°–180°, 83°–105°, 0°–38°), most preferably (82°, 92°, 37°). When the substrate 10 is a lithium tantalate substrate, the substrate has a plane orientation and a surface acoustic wave propagation direction which are, as expressed in Eulerian angles, in the ranges of (0°–87°, 80°–120°, 0°–44°) or (91°–180°, 80°–120°, 0°–44°) , more preferably in the range of (0°–85°, 87°–114°, 0°–36°) or (93°–180°, 87°–114°, 0°–36°), most preferably (85°, 91°, 31°).

Figure 10:
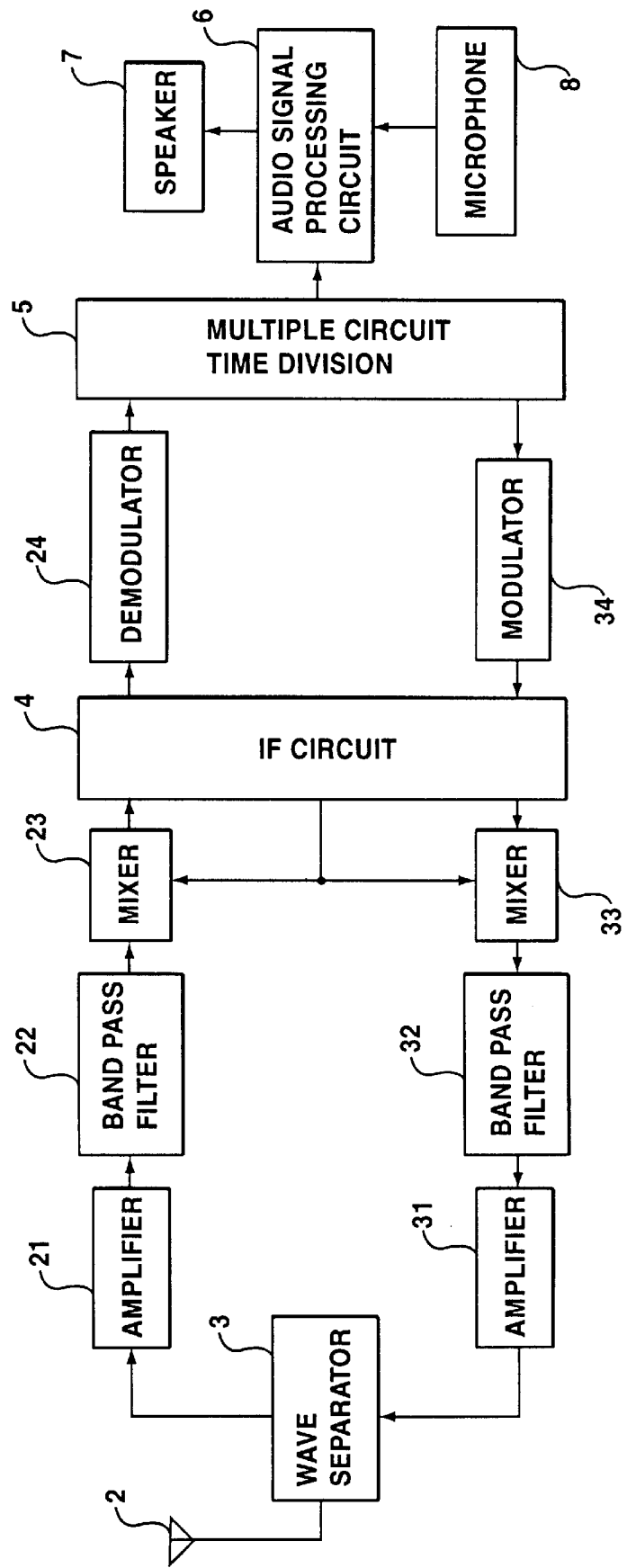
FIG. 10 is a block diagram showing the overall construction of a portable telephone.
Figure 11:
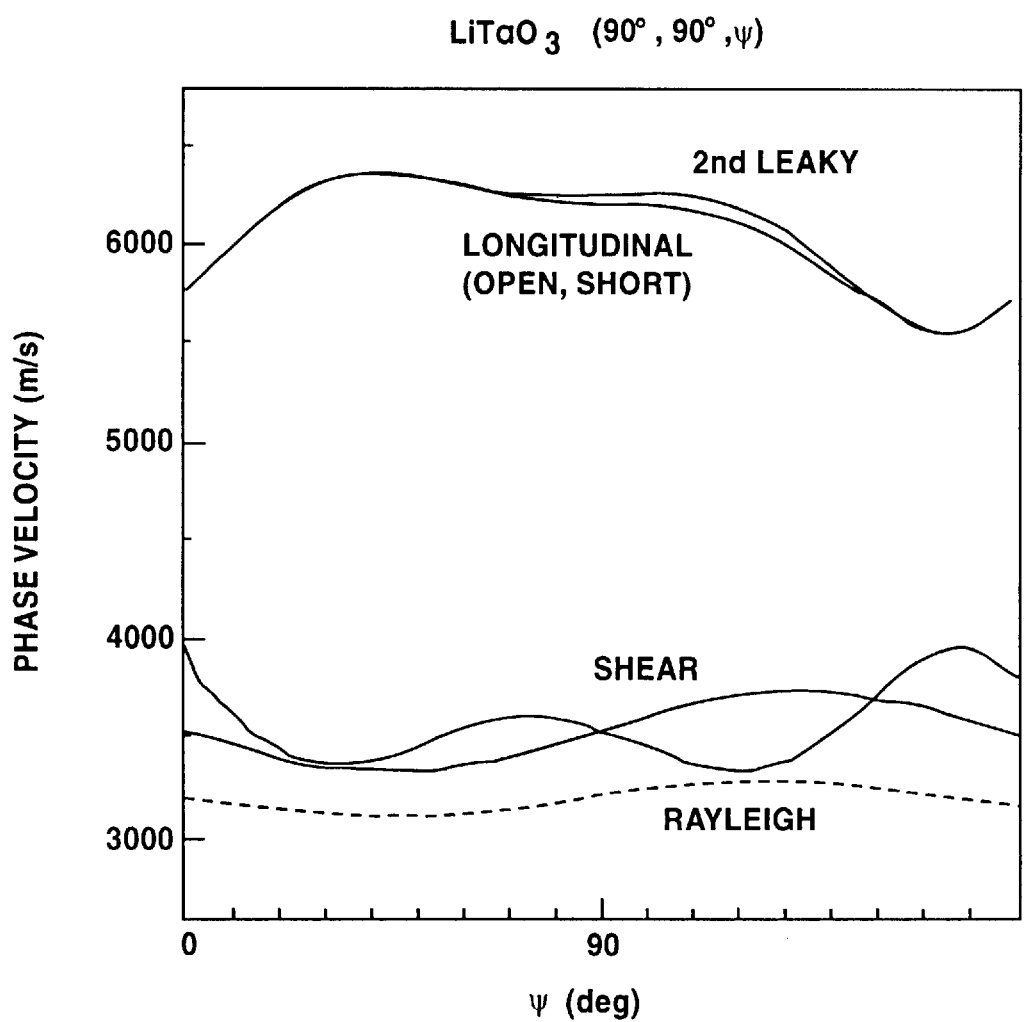
FIG. 11 is a graph showing the phase velocity characteristics of surface acoustic wave device having a lithium tantalate substrate with (90°, 90°, ψ) cut.
Figure 12:
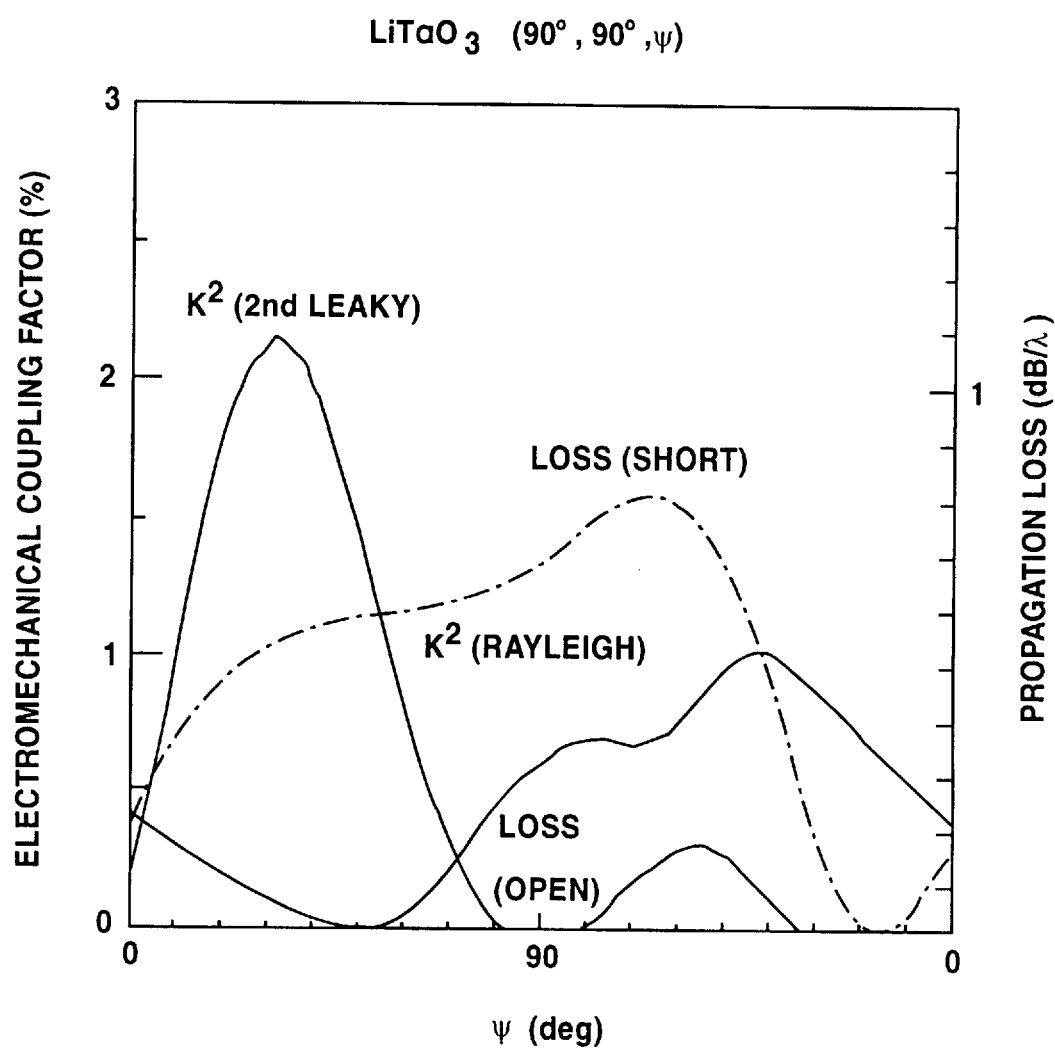
FIG. 12 is a graph showing the electromechanical coupling factor and propagation loss characteristics of these surface acoustic wave devices.
Figure 13:
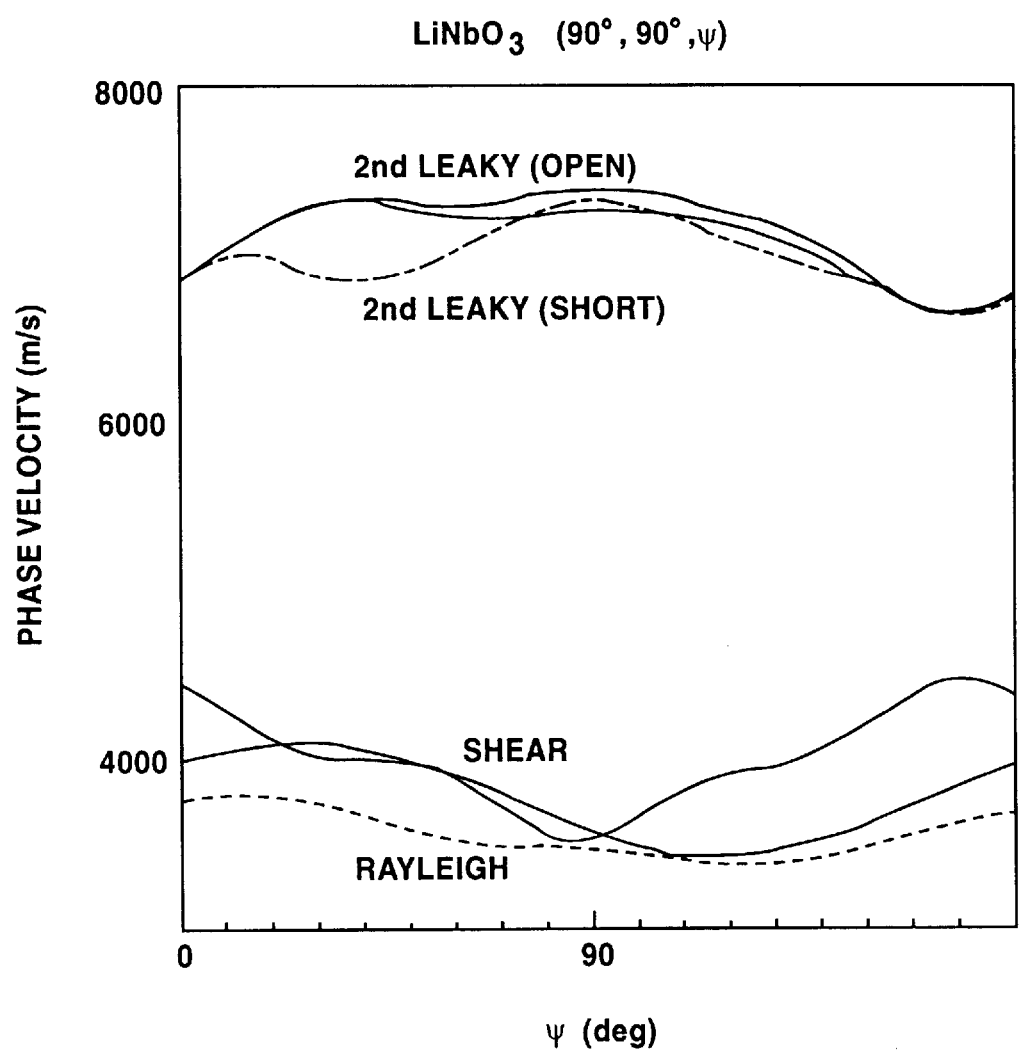
FIG. 13 is a graph showing the phase velocity characteristics of surface acoustic wave device having a lithium niobate substrate with (90°, 90°, ψ) cut.
Figure 14:
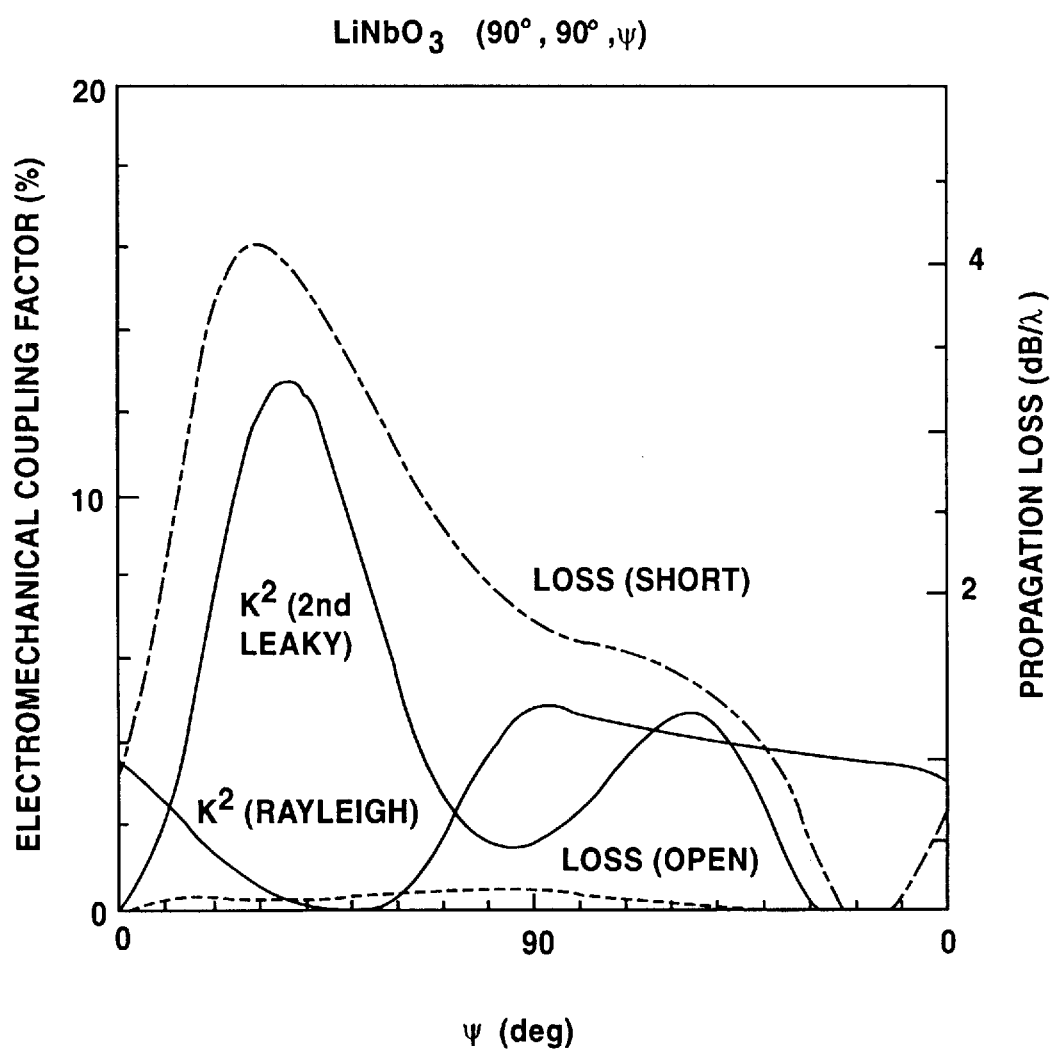
FIG. 14 is a graph showing the electromechanical coupling factor and propagation loss characteristics of these surface acoustic wave devices.
Figure 15:
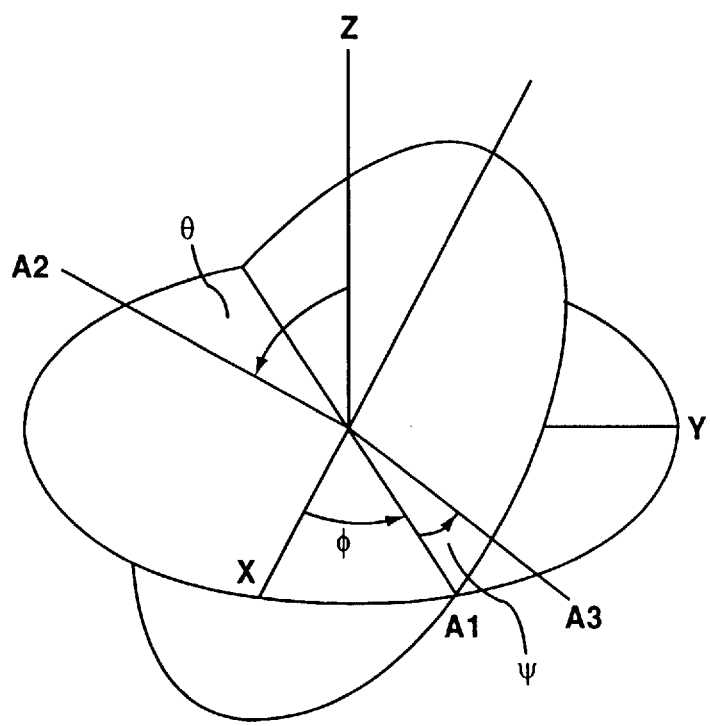
FIG. 15 is a diagram for illustrating Eulerian angle expressions.

FIG. 10 shows the overall construction of a portable telephone embodying the invention. The surface acoustic wave filter mentioned above is used as each of band-pass filters 22, 32. A wave separator 3 comprises a filter for passing audio signals of transmission frequency and a filter for passing audio signals of receiving frequency. The surface acoustic wave filter serves as each of these filters. An IF circuit 4 comprises one or a plurality of high-frequency filters, and the surface acoustic wave filter also serves as the high-frequency filter.

With reference to the drawing, the audio signals received by an antenna 2 are first supplied to the wave separator 3, by which the audio signal of receiving frequency is separated off and fed to an amplifier 21. The amplified signal is fed to the band-pass filter 22 for the removal of noise signal. The resulting signal is sent to a mixer 23 and converted to a first frequency signal having a frequency lower than the receiving frequency, based on a signal from the IF circuit 4. The signal is fed to the IF circuit 4 and converted to a second frequency signal having a still lower frequency. The second frequency signal is sent out from the IF circuit 4 to a demodulator 24, thereby demodulated and fed to a speaker 7 via a time division multiple circuit 5 and audio signal processing circuit 6.

On the other hand, the audio signal from a microphone 8 is fed to a modulator 34 via the audio signal processing circuit 6 and the time division multiple circuit 5, and the modulated signal is fed to the IF circuit 4, which converts the signal to a third frequency signal higher than the audio signal from the microphone 8 in frequency. The third frequency signal output from the IF circuit 4 is fed to a mixer 33, converted to an audio signal of higher transmission frequency and then sent to the band-pass filter 32 for the removal of noise signal. The resulting signal is fed to an amplifier 31, and the amplified signal is sent to the wave separator and then transmitted from the antenna 2.

As previously stated, we have theoretically studied second leaky waves on lithium niobate substrates and lithium tantalate substrates to discover optimum cut plane and surface acoustic wave propagation direction, consequently making it possible to provide a surface acoustic wave filter which is useful for a higher frequency band than in the prior art. When incorporating this filter as a high-frequency filter, portable telephones can be adapted to exhibit improved performance.

The embodiments described above are intended to illustrate the present invention and should not be construed as limiting the invention set forth in the appended claims or restricting the scope thereof. Furthermore, the devices of the invention are not limited to the foregoing embodiments in construction but can of course be modified variously without departing from the spirit of the invention as set forth in the claims.

What is claimed is:

1. A surface acoustic wave device, comprising:
a piezoelectric substrate of lithium niobate and electrodes formed on the substrate for propagating second leaky waves, wherein the piezoelectric substrate has a cut plane and a surface acoustic wave propagation direction which are ($\phi$, $\theta$, $\psi$) as expressed in Eulerian angles and within ranges substantially equivalent thereto, the angles $\phi$, $\theta$ and $\psi$ being within the respective ranges of the following mathematical expressions:

$80° \leq \phi \leq 86°$ $73° \leq \theta \leq 118°$ $34° \leq \psi \leq 44°$.

2. A surface acoustic wave device as defined in claim 1, wherein $\phi$, $\theta$ and $\psi$ are within the respective ranges of the following mathematical expressions:

$80° \leq \phi \leq 83°$ $83° \leq \theta \leq 105°$ $34° \leq \psi \leq 38°$.

3. A surface acoustic wave device, comprising:
a piezoelectric substrate of lithium niobate and electrodes formed on the substrate for propagating second leaky waves, wherein the piezoelectric substrate has a cut plane and a surface acoustic wave propagation direction which are ($\phi$, $\theta$, $\psi$) as expressed in Eulerian angles and within ranges substantially equivalent thereto, the angles $\phi$, $\theta$ and $\psi$ being within the respective ranges of the following mathematical expressions:

$95° \leq \phi \leq 100°$ $73° \leq \theta \leq 118°$ $34° \leq \psi \leq 44°$.

4. A surface acoustic wave device as defined in claim 3, wherein $\phi$, $\theta$ and $\psi$ are within the respective ranges of the following mathematical expressions:

$98° \leq \phi \leq 100°$ $83° \leq \theta \leq 105°$ $34° \leq \psi \leq 38°$.

5. A surface acoustic wave device, comprising:
a piezoelectric substrate of lithium tantalate and electrodes formed on the substrate for propagating second leaky waves, wherein the piezoelectric substrate has a cut plane and a surface acoustic wave propagation direction which are ($\phi$, $\theta$, $\psi$) as expressed in Eulerian angles and within ranges substantially equivalent thereto, the angles $\phi$, $\theta$ and $\psi$ being within the respective ranges of the following mathematical expressions:

$83° \leq \phi \leq 87°$ $80° \leq \theta \leq 91°$, or $110° \leq \theta \leq 120°$ $30° \leq \psi \leq 44°$.

6. A surface acoustic wave device as defined in claim 5, wherein $\phi$, $\theta$ and $\psi$ are within the respective ranges of the following mathematical expressions:

$83° \leq \phi \leq 85°$ $87° \leq \theta \leq 91°$, or $110° \leq \theta \leq 114°$ $30° \leq \psi \leq 36°$.

7. A surface acoustic wave device, comprising:
a piezoelectric substrate of lithium tantalate and electrodes formed on the substrate for propagating second leaky waves, wherein the piezoelectric substrate has a cut plane and a surface acoustic wave propagation direction which are ($\phi$, $\theta$, $\psi$) as expressed in Eulerian angles and within ranges substantially equivalent thereto, the angles $\phi$, $\theta$ and $\psi$ being within the respective ranges of the following mathematical expressions:

$91° \leq \phi \leq 95°$ $80° \leq \theta \leq 91°$, or $100° \leq \theta \leq 120°$ $30° \leq \psi \leq 44°$.

8. A surface acoustic wave device as defined in claim 7, wherein $\phi$, $\theta$ and $\psi$ are within the respective ranges of the following mathematical expressions:

$93° \leq \phi \leq 95°$ $87° \leq \theta \leq 91°$, or $110° \leq \theta \leq 114°$ $30° \leq \psi \leq 36°$.

9. A portable telephone including a surface acoustic wave filter, comprising at least one surface acoustic wave device, wherein the surface acoustic wave device comprises a piezoelectric substrate of lithium niobate and electrodes formed on the substrate for propagating second leaky waves, wherein the piezoelectric substrate has a cut plane and a surface acoustic wave propagation direction which are ($\phi$, $\theta$, $\psi$) as expressed in Eulerian angles and within ranges substantially equivalent thereto, the angles $\phi$, $\theta$ and $\psi$ being within the respective ranges of the following mathematical expressions:

$80° \leq \phi \leq 86°$ $73° \leq \theta \leq 118°$ $34° \leq \psi \leq 44°$.

10. A portable telephone including a surface acoustic wave filter, comprising at least one surface acoustic wave device, wherein the surface acoustic wave device comprises a piezoelectric substrate of lithium niobate and electrodes formed on the substrate for propagating second leaky waves, wherein the piezoelectric substrate has a cut plane and a surface acoustic wave propagation direction which are ($\phi$, $\theta$, $\psi$) as expressed in Eulerian angles and within ranges substantially equivalent thereto, the angles $\phi$, $\theta$ and $\psi$ being within the respective ranges of the following mathematical expressions:

$95° \leq \phi \leq 100°$ $73° \leq \theta \leq 118°$ $34° \leq \psi \leq 44°$.

11. A portable telephone including a surface acoustic wave filter, comprising at least one surface acoustic wave device, wherein the surface acoustic wave device comprises a piezoelectric substrate of lithium tantalate and electrodes formed on the substrate for propagating second leaky waves, wherein the piezoelectric substrate has a cut plane and a surface acoustic wave propagation direction which are ($\phi$, $\theta$, $\psi$) as expressed in Eulerian angles and within ranges substantially equivalent thereto, the angles $\phi$, $\theta$ and $\psi$ being within the respective ranges of the following mathematical expressions:

$83° \leq \phi \leq 87°$ $80° \leq \theta \leq 91°$, or $110° \leq \theta \leq 120°$ $30° \leq \psi \leq 44°$.

12. A portable telephone including a surface acoustic wave filter, comprising at least one surface acoustic wave device, wherein the surface acoustic wave device comprises a piezoelectric substrate of lithium tantalate and electrodes formed on the substrate for propagating second leaky waves, wherein the piezoelectric substrate has a cut plane and a surface acoustic wave propagation direction which are ($\phi$, $\theta$, $\psi$) as expressed in Eulerian angles substantially equivalent thereto, the angles $\phi$, $\theta$ and $\psi$ being within the respective ranges of the following mathematical expressions:

$91° \leq \phi \leq 95°$ $80° \leq \theta \leq 91°$, or $110° \leq \theta \leq 120°$ $30° \leq \psi \leq 44°$.

* * * * *

UNITED STATES PATENT AND TRADEMARK OFFICE
CERTIFICATE OF CORRECTION

PATENT NO. : 5,854,527
DATED : December 29, 1998
INVENTOR(S) : SHIMIZU et al.

It is certified that error appears in the above-indentified patent and that said Letters Patent is hereby corrected as shown below:

In claim 12, on line 27 of column 12 in claim 12, change "... Eulerian angles substantially ..." to be --... Eulerian angles and within ranges substantially ...--.

Signed and Sealed this

Sixteenth Day of November, 1999

Attest:

Q. TODD DICKINSON

Attesting Officer        Acting Commissioner of Patents and Trademarks

UNITED STATES PATENT AND TRADEMARK OFFICE
CERTIFICATE OF CORRECTION

PATENT NO.   : 5,854,527  
DATED        : December 29, 1998  
INVENTOR(S)  : Shimizu et al.

Page 1 of 1

It is certified that error appears in the above-identified patent and that said Letters Patent is hereby corrected as shown below:

Column 10,  
Line 62, please change "100" to -- 110 --.

Signed and Sealed this

Thirty-first Day of May, 2005

JON W. DUDAS  
*Director of the United States Patent and Trademark Office*